United States Patent [19]
Byrne et al.

[11] Patent Number: 5,619,204
[45] Date of Patent: Apr. 8, 1997

[54] ANALOG-TO-DIGITAL CONVERTER WITH OPTIONAL LOW-POWER MODE

[75] Inventors: Michael Byrne, Limerick, Ireland; Colin Price, Newbury, England; John Reidy, Limerick, Ireland; Simon Smith, Manchester, United Kingdom

[73] Assignee: Analog Devices, Incorporated, Norwood, Mass.

[21] Appl. No.: 394,709

[22] Filed: Feb. 27, 1995

[51] Int. Cl.$^6$ .................................................. H03M 1/00
[52] U.S. Cl. .............................................. 341/155; 341/156
[58] Field of Search ........................................ 341/144, 156

[56] References Cited

U.S. PATENT DOCUMENTS 4,963,840  10/1990  Thommen ............................... 331/111

OTHER PUBLICATIONS

*3VCLC$^2$MOS 12–Bit, Serial 8 s ADC in 8–Pin Package*, Analog Devices, Prelim. B Sep. 1993.
Analog Devices—LC$^2$MOS 8–channel, 12–bit serial data acquisition system AD7890.

*Primary Examiner*—Jeffrey A. Gaffin
*Assistant Examiner*—Peguy JeanPierre
*Attorney, Agent, or Firm*—Parmelee, Bollinger & Bramblett

[57] ABSTRACT

An IC chip having an analog-to-digital converter together with control circuitry for effecting switchover between normal-power mode and low-power mode. The control circuitry includes a first D-type flip-flop with reset which receives on its "D" input a continuous high signal; on its differential clock inputs the flip-flop receives complementary logic signals derived from the "conversion start" (CONVST) signal applied to one pin of an 8-pin chip. In normal mode, the CONVST signal is a short pulse having an initial negative-going (falling) leading edge, and the flip-flop responds to that leading edge by producing a high Q output (CONVEN). This signals the A/D converter to carry out a conversion. In low-power mode, the CONVST short pulse is positive. The subsequent negative-going (falling) trailing edge of the pulse activates the flip-flop to cause its Q output to go high and turn on the A/D converter. The control circuitry includes a second D-type flip-flop (this one with set) which receives on its D input the CONVST signal. The Q output. of the second flip-flop generates a mode switchover control signal (designated SLEEPB). During low-power mode, established by the use of positive-going CONVST pulses, the low CONVEN signal at the end of conversion clocks the second flip-flop to sample CONVST on its D input, thereby causing the Q output of the second flip-flop (SLEEPB) to go low and switch the A/D converter into low-power status.

9 Claims, 6 Drawing Sheets

ANALOG-TO-DIGITAL CONVERTER WITH OPTIONAL LOW-POWER MODE

BACKGROUND OF THE INVENTION

1. Field of the Invention

This invention relates to integrated circuit (IC) chips the circuitry of which is controllably switchable to a low-power-consumption non-operating status to conserve power, as for use in battery-operated apparatus and the like. More particularly, this invention relates to an IC chip having an analog-to-digital converter which is controllably switchable between a normal mode and a low-power-consumption mode wherein the power consumption is drastically curtailed during times between conversion operations.

2. Description of the Prior Art

The growth in use of battery-operated equipment, such as lap-top computers, has sharply increased the need to reduce power consumption in the integrated-circuit devices employed in such equipment. Various ways of reducing the power consumption have been developed. One important technique has been that of supplying full-power to the device only during short periods of normal operation, and placing the device in inactive mode (sometimes called "power down" or "sleep mode") during intervening non-operating periods. For example, in an integrated-circuit chip having a number of transistors for amplifiers, converters, or other function elements, the transistor bias voltages can be switched by a control signal to levels precluding normal operating current flows, thereby reducing the power drain by a factor of 100 or even 1000 to one.

Although such power-reducing circuitry has come into considerable use for A/D converters, there has remained a problem of how best to develop the control signal for switchover between normal power mode and low-power mode. If the chip is switched from low-power mode to normal power mode every time a conversion operation is carried out, the time required to carry out a conversion operation will increase significantly since the power to the converter circuitry must first be brought back up to operational levels prior to performing the conversion. Thus, it is desirable to allow the user to choose whether the IC chip should automatically switch to low-power mode after each period of operation, or whether the part should remain in full-power mode at all times in order to ensure fastest overall operational speed. In addition, controlling the switchover between normal mode (continuous full power) and low-power mode (intermittent full-power operation) advantageously should be effected by means which do not require an additional pin on the IC part, or adding to the bits in the control register for the part. Moreover, the apparatus for effecting this switchover should be reliable in operation yet modest in additional cost.

SUMMARY OF THE INVENTION

In a presently preferred embodiment of the invention, to be described hereinbelow in detail, there is provided an IC chip having an analog-to-digital converter together with control circuitry for effecting switchover between normal-power mode and low-power mode. This control circuitry includes a first D-type flip-flop with reset which receives on its "D" input a continuous high signal; on its differential clock inputs the flip-flop receives complementary logic signals derived from the "conversion start" (CONVST) signal applied to one pin of the 8-pin chip by the associated apparatus (e.g., a lap-top computer) requiring analog-to-digital conversions.

In normal mode, the CONVST signal is a short pulse having an initial negative-going (falling) leading edge, and the flip-flop responds to that leading edge by producing a high Q output, referred to as "convert enable" or CONVEN. This high signal is directed to the A/D converter to cause it to carry out a conversion of the analog signal. At the end of conversion, the reset input (R) of the flip-flop receives a logic signal designated EOC (end-of-conversion) which goes low to switch the Q output low, thereby causing CONVEN to go low and turning off the A/D converter.

In low-power mode, the CONVST short pulse is a positive pulse, i.e., it has an initial positive-going (rising) leading edge. A rising edge is not sensed by a reset flip-flop, but the subsequent negative-going (falling) trailing edge of the pulse does however activate the flip-flop to cause its Q output to go high and turn on the A/D converter.

To switch the chip to low-power status, wherein the power to the operating circuitry is reduced by 100 to 1000 to one, the control circuitry includes a second D-type flip-flop (this one with set) which receives on its D input the CONVST signal. This second flip-flop has its set input (S) (active low) connected to receive the complement of the CONVST signal, and is clocked by the CONVEN signal from the Q output of the first flip-flop. The Q output of the second flip-flop generates a low-power switchover control signal (designated SLEEPB) which during normal-mode operation is continuously high so as to provide full-power during and between the conversions. However, when low-power mode has been established by the use of positive-going CONVST pulses, the low CONVEN signal (Q output of the first flip-flop) at the end of conversion (when EOC goes low) clocks the second flip-flop to sample CONVST on its D input.

Since CONVST now is low (at the end of the positive-going short pulse), the Q output of the second flip-flop (SLEEPB) goes low, thereby switching the A/D converter into low-power status. This status remains in effect until CONVST again goes high causing SLEEPB to go high at the output of the second flip-flop, and starting another conversion at the falling (trailing) edge of the CONVST pulse. The control circuitry used for carrying out the switchover to low-power status is reliable in operation and low in added cost for the chip.

Other objects, aspects and advantages of the invention will in part be pointed out in, and in part apparent from, the following description of a preferred embodiment considered together with the accompanying drawings.

DESCRIPTION OF THE PREFERRED EMBODIMENT

Figure 1:
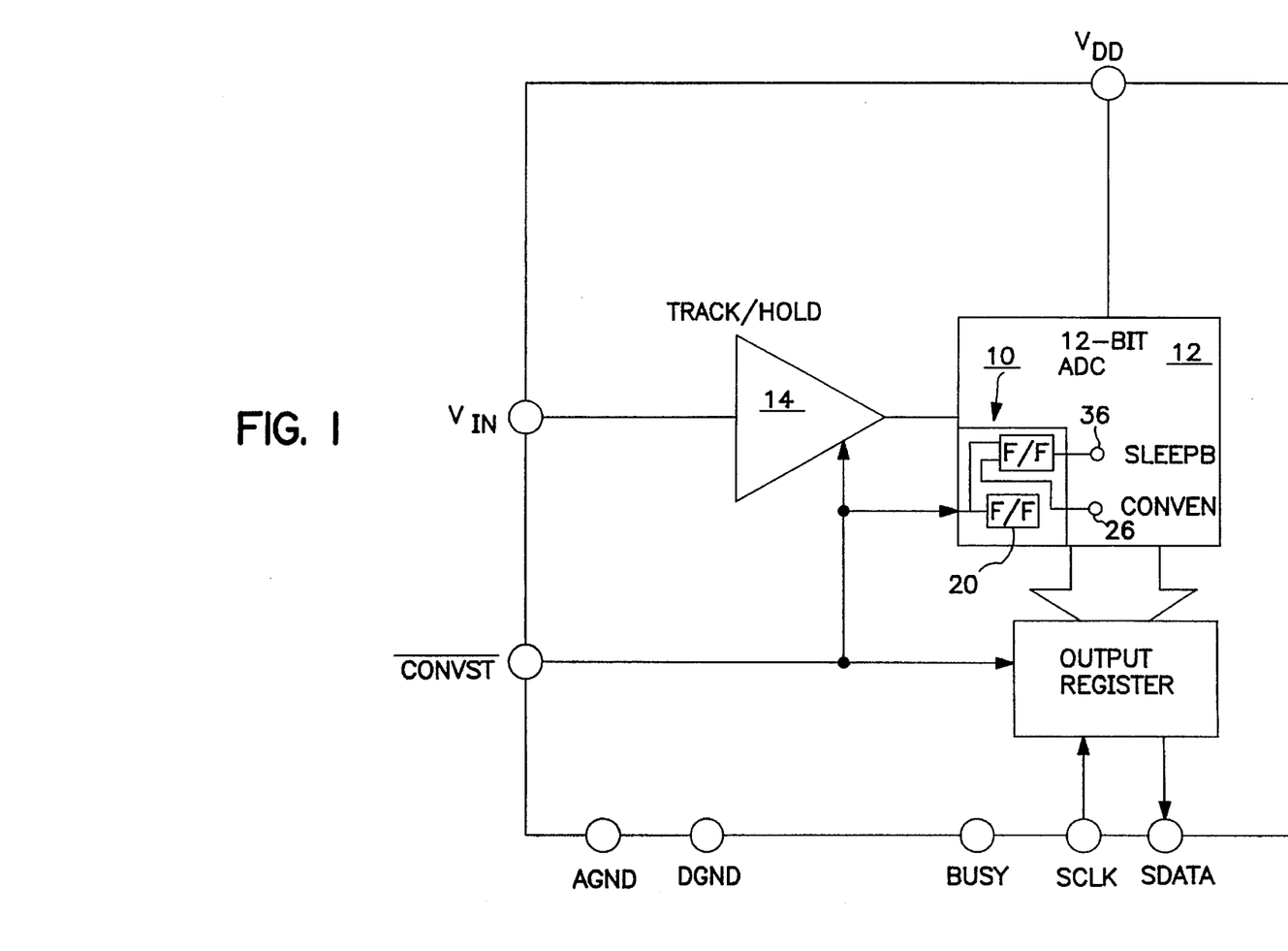
FIG. 1 is a block diagram showing an a-to-d chip incorporating the present invention.

Referring first to FIG. 1, an A/D converter IC chip is shown with the usual input/output pins (eight, for the part described). These include a d-c power supply terminal $V_{DD}$ and ground terminals AGND (analog ground) and DGND (digital ground). Also included are SCLK (serial clock), SDATA (serial data), and BUSY, the signal from which indicates that the part is in the process of carrying out a conversion. The principal input signal pins are $V_{IN}$ (for the analog signal to be converted to a digital signal), and CONVST, which stands for "convert start". When a conversion is complete, the digital data can be taken from SDATA for further processing, in accordance with system requirements.

The chip of FIG. 1 includes control circuitry 10 for developing a convert enable (CONVEN) signal and for controllably switching the A/D converter circuitry 12 between normal mode (where the A/D converter is maintained at full operating power at all times) and low-power mode (where the chip performs its a-to-d conversion at full power but automatically switches to low-power status at times between conversion operations).

Figure 2:
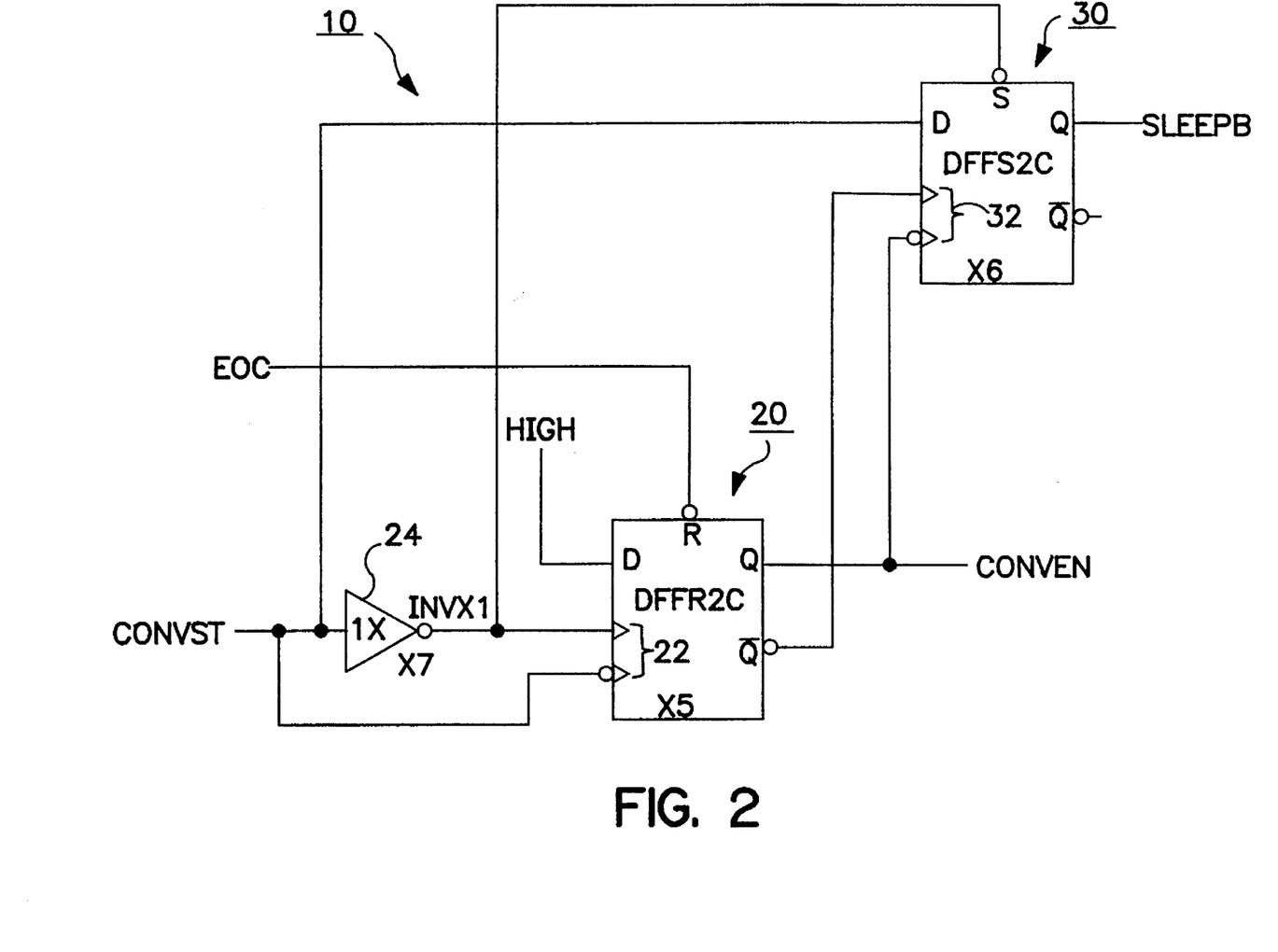
FIG. 2 is a schematic diagram of the control circuitry portion of the FIG. 1 diagram.

FIG. 2 shows further details of the control circuitry 10 for controlling the A/D converter 12 including the function of switchover between normal power mode and low-power mode. This control circuitry includes a first D-type flip-flop 20 with reset which receives on its "D" input terminal a permanent high signal. The differential clock input terminals 22 receive complementary clock signals derived from the CONVST input. One signal path passes through an inverter 24 to establish the complementary (inverted) relationship.

Figure 3:
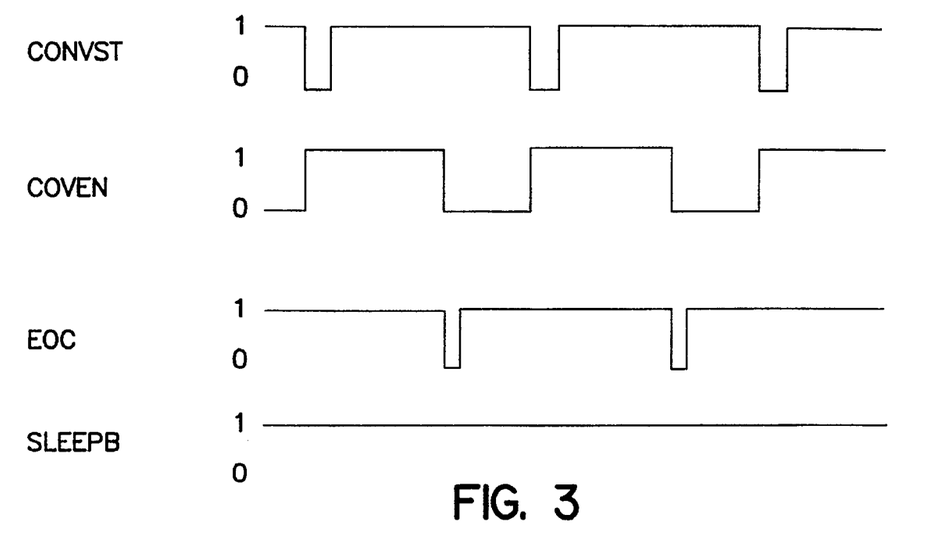
FIG. 3 is a timing diagram showing selected timing signals produced during normal operation.

For normal mode operation (i.e., wherein the converter operates without making use of low-power status), the CONVST signals are short pulses the leading edge of which is negative-going (falling), as shown in FIG. 3. The reset flip-flop 20 responds to such a falling leading edge by developing a high Q output signal. This output signal is connected to the control signal line CONVEN standing for "convert enable" and which is connected to a CONVEN terminal 26 of the A/D converter 12 as shown in FIG. 1.

The CONVST signal also applies a corresponding high control signal to the Track/Hold circuitry 14 which holds the analog input signal $V_{IN}$ and directs that signal to the A/D converter circuitry 12 for a conversion operation. The high CONVEN signal on terminal 26 functions in known ways to cause the converter 12 to carry out an a-to-d conversion, in this case by performing a successive-approximation algorithm to develop a digital signal representing the analog input $V_{IN}$ held by the Track/Hold circuitry 14.

After a preestablished time period (e.g., 8 μseconds), the conversion algorithm will have been completed and timing means (not shown) forming part of the control circuitry 10 produces a logic high signal designated EOC (FIG. 2) and signifying the end-of-conversion. This signal is applied to the R (reset) terminal (active low) of the flip-flop 20 thus switching the flip-flop Q output low. This causes CONVEN to go low, and that turns off the A/D converter.

Figure 4:
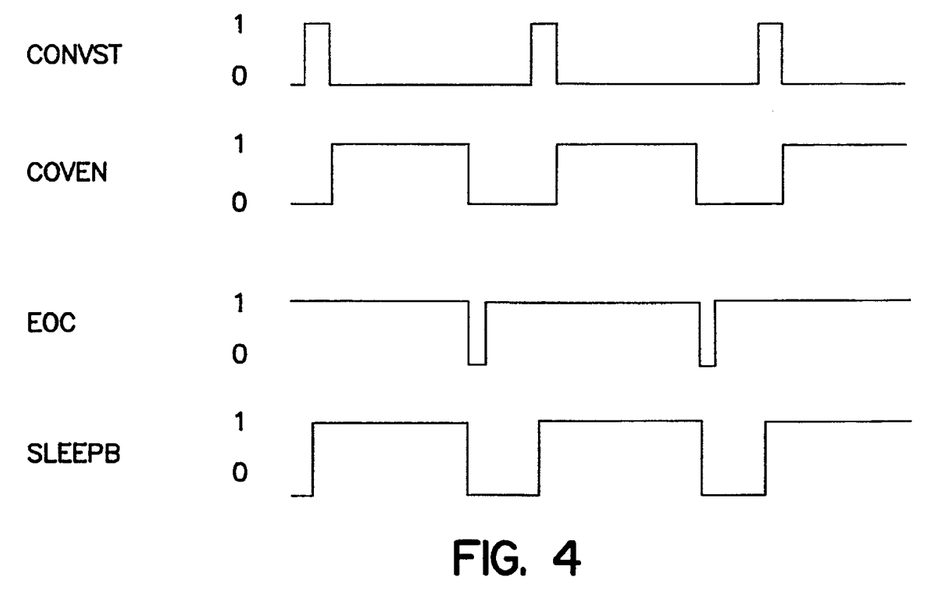
FIG. 4 is a timing diagram showing selected timing signals produced during low-power mode operation.
Figure 5:
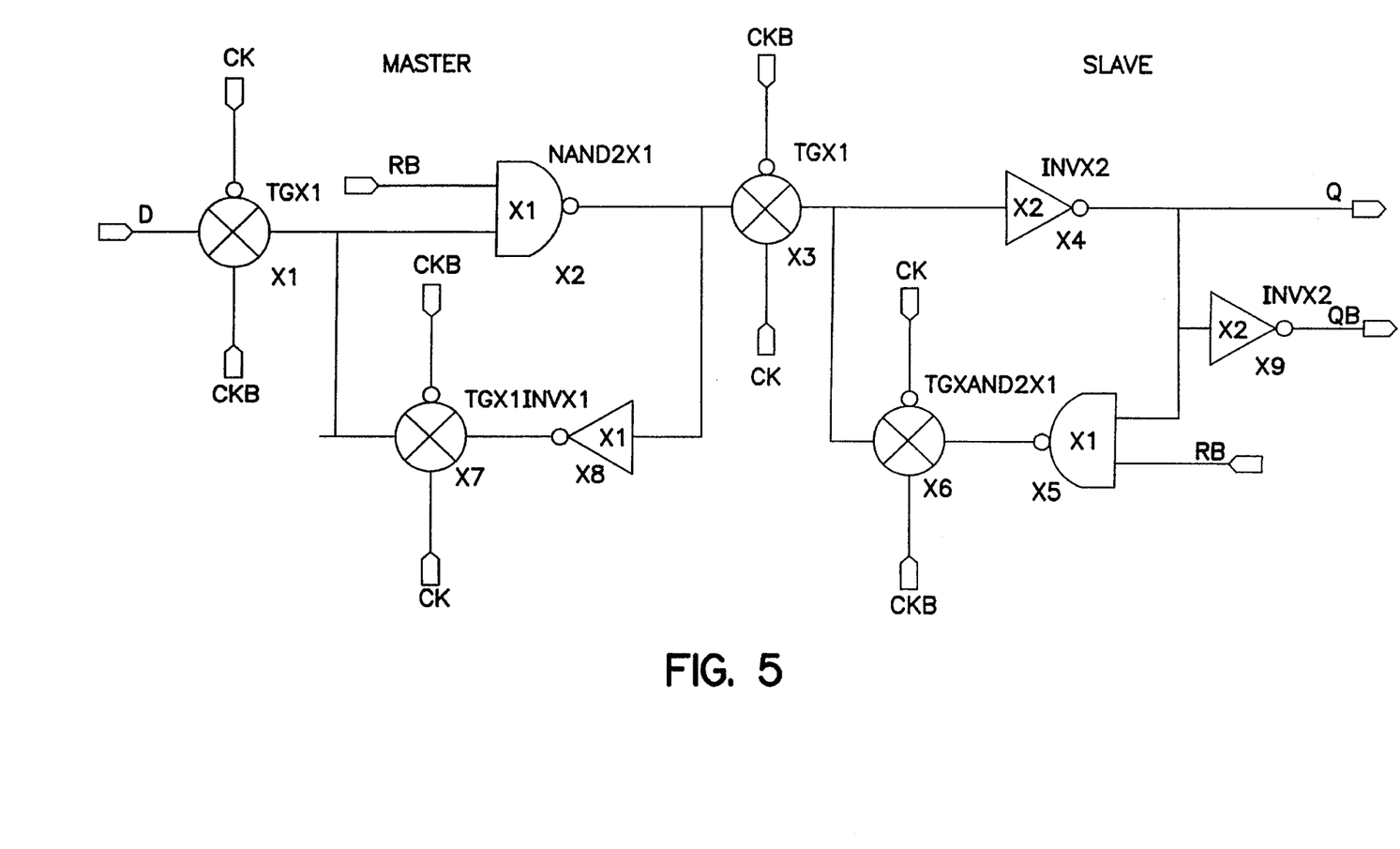
FIG. 5 shows diagrammatically how the reset D-type flip-flop of FIG. 2 is constructed.
Figure 6:
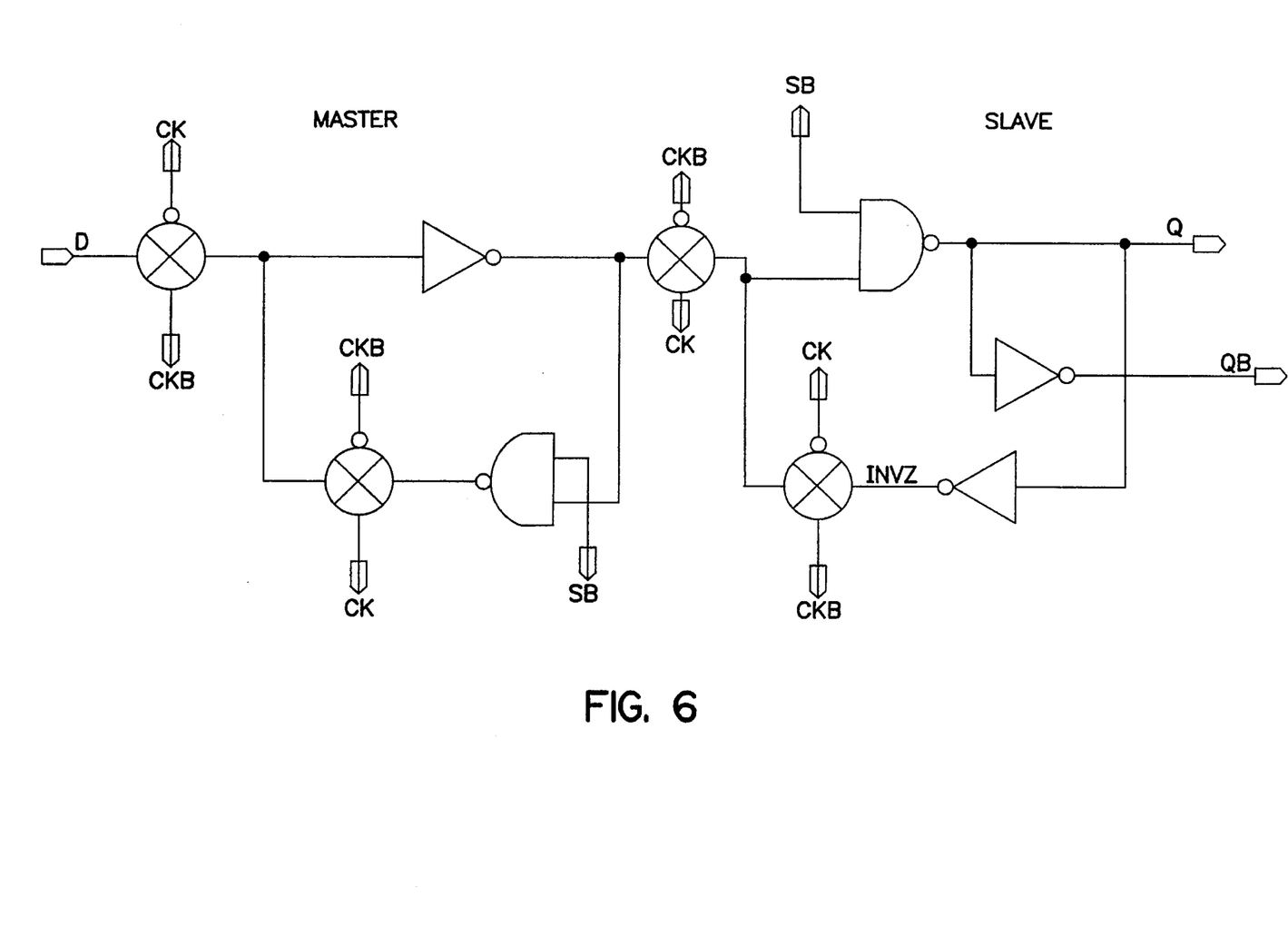
FIG. 6 shows diagrammatically how the set D-type flip-flop of FIG. 2 is constructed.

To activate the converter in its low-power mode, the user will arrange the CONVST signal pulse to be positive-going (rising), as shown in FIG. 4. The positive-going leading edge of this pulse will not set the flip-flop 20, but the subsequent negative-going (falling) edge will cause the Q output of that flip-flop to go high. CONVEN therefore will go high and activate the A/D converter 12 as before. Thus, the converter will carry out its conversion operation and produce a digital signal corresponding to the analog input signal $V_{IN}$.

A second D-type flip-flop 30 is provided, in this case of the set (S) type. This flip-flop is arranged to receive the CONVST signal on its D input terminal, with the complement of CONVST being directed to the set (S) terminal (active low). This second flip-flop 30 receives on its clock input terminals 32 the complementary CONVEN signals from the first flip-flop 20. When the positive-going leading edge of CONVEN is received at the second flip-flop, its Q output (designated SLEEPB) goes high (or will already be high from a prior normal-mode operation), thereby providing for full-power operation of the converter during the actual conversion period.

When the timed signal EOC subsequently goes low, signifying that the conversion operation has been completed, the first flip-flop 20 will switch its Q output CONVEN low. That signal, applied to the clock inputs 32 of the second flip-flop, causes that flip-flop to sample the CONVST signal on its D input terminal. Since for low-power mode the CONVST signal is a positive-going pulse, it will be low when it is sampled at the time of EOC. Therefore, the Q output (SLEEPB) of the second flip-flop 30 will go low, and that low signal applied to the SLEEPB terminal 36 of the A/D converter 12 will switch the converter into low-power status where the current drain is 1/100 to 1/1000 of the normal operating power.

The A/D converter 12 will remain in this low-power-consumption condition until another conversion operation is called for. At that time, CONVST will go high, activating the second flip-flop 30 to cause its Q output (SLEEPB) to go high at the converter terminal 36, thereby initiating return of the converter to its normal operating power condition. At the end of the CONVST pulse, its falling edge will activate the first flip-flop 20 so that its high Q output (CONVEN) will go high to call for another conversion operation.

For some applications it may be preferable to develop the SLEEPB logic signal by making use of the "BUSY" signal which is produced internally to appear at the BUSY pin shown in FIG. 1. The BUSY signal is high while the part is carrying out a conversion, and is controlled by the timer (not shown) which controls the EOC signal previously referred to. In one A/D converter embodiment, the conversion took about 8 μseconds to complete, and the BUSY signal was high during that time period. The EOC signal went low at the end of that period.

Figure 7:
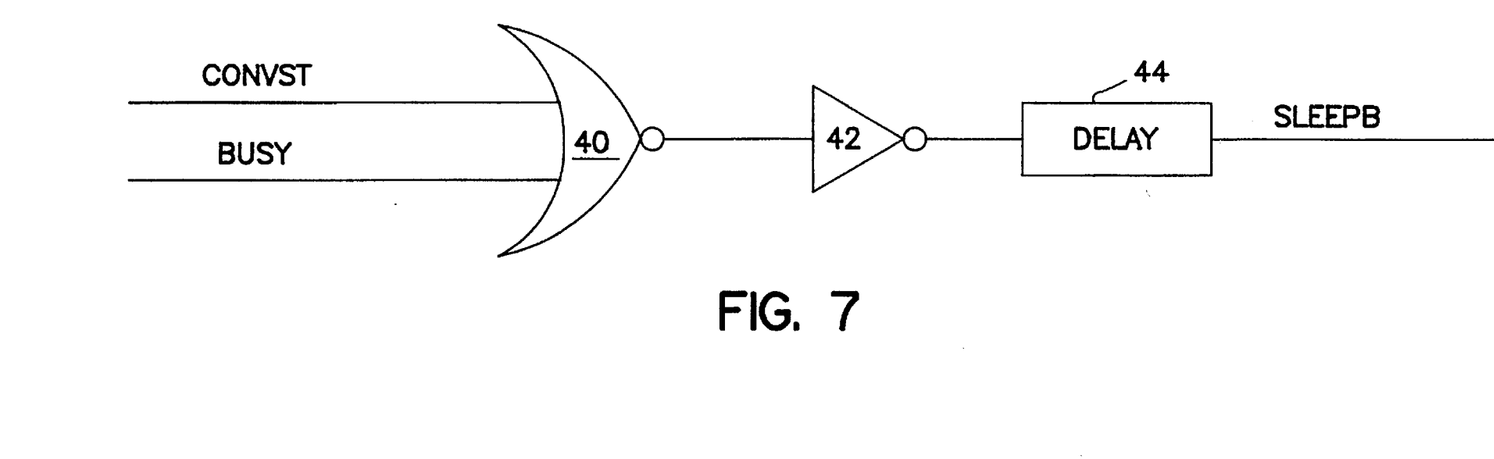
FIG. 7 is a diagram showing how the SLEEPB logic signal can be generated using the BUSY signal.

Referring now to FIG. 7, the BUSY signal is directed to a Nor gate 40 together with the CONVST signal referred to previously. The function of a Nor gate (which is the equivalent of an OR gate with an inverter in its output circuit), is to produce a low output when there is a high signal on either or both inputs. The output of the Nor gate 40 is inverted by an inverter 42 and delayed by a delay circuit 44 to produce SLEEPB.

In normal operation (see FIG. 3), when BUSY is high at the start of a conversion, SLEEPB will be high, so normal power will be supplied to the A/D converter. When BUSY goes low at the end of conversion (at the same time EOC goes low), CONVST will be high. Thus, the circuit of FIG. 7 continues to produce a high SLEEPB signal, maintaining normal power.

In low-power-mode (FIG. 4), CONVST goes high at the start of conversion, so SLEEPB will be high. When CONVST goes low, BUSY will go high to hold SLEEPB high until the end of conversion. When BUSY goes low (at the same time as EOC goes low), the Nor gate 40 will have two low inputs, and thus its output will go high, producing a low SLEEPB and thereby placing the part in low-power condition. The delay circuit 44 delays the signal about 10–20 nanoseconds, and is provided to avoid having the part receive a false control signal placing it in low-power status just before the start of a conversion.

When the FIG. 7 arrangement is used to produce SLEEPB, the convert enable (CONVEN) is produced in the way shown in FIG. 2, using the flip-flop 20.

Although preferred embodiments of the invention has been described in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. An IC chip having A/D converter circuitry for converting an applied analog signal to a corresponding digital signal; said chip including one pin to which a conversion start signal (CONVST) can be applied from associated apparatus; means to transmit an end-of-conversion signal (EOC); said A/D circuitry including first terminal means to receive a convert-enable signal (CONVEN) for initiating a conversion and second terminal means to transmit a mode switchover signal (SLEEP) to place the A/D circuitry either in a normal-power mode or in a low-power mode in which the power consumed between conversions is substantially less than that consumed during a conversion operation;

control circuitry for developing said CONVEN signal and said mode switchover signal, comprising:

a first D-type flip-flop with reset;

means applying a fixed signal to the D-terminal of said first D-type flip-flop;

means connecting said CONVST signal to the clock input of said first D-type flip-flop;

means connecting said EOC signal to the reset (R) terminal of said first D-type flip-flop;

means connecting the Q output of said first D-type flip-flop to said first terminal means to initiate an analog-to-digital conversion in response to an output signal of said first D-type flip-flop;

a second D-type flip-flop with set;

means connecting the clock input of said second D-type flip-flop to the output of said first D-type flip-flop;

means connecting said CONVST signal to the D input of said second D-type flip-flop;

means connecting the complement of said CONVST signal to the set (S) terminal of said second D-type flip-flop; and means connecting the Q output of said second D-type flip-flop to said second terminal means to provide for low-power operation upon receipt of said Q output from said second D-type flip-flop.

2. Apparatus as in claim 1, wherein said first D-type flip-flop has two clock inputs; and means supplying the direct and complement of said CONVST signal to said two clock inputs respectively.

3. Apparatus as in claim 2, wherein said second D-type flip-flop has two clock inputs; and means supplying the Q and $\overline{Q}$ outputs of said first D-type flip-flop to said second D-type flip-flop clock inputs respectively.

4. An IC chip having A/D converter circuitry for converting an applied analog signal to a corresponding digital signal; said chip including one pin to which a conversion start signal (CONVST) can be applied from associated apparatus; means to transmit an end-of-conversion signal (EOC); means to transmit a BUSY signal when the A/D converter is carrying out a conversion; said A/D circuitry including first terminal means to receive a convert-enable signal (CONVEN) for initiating a conversion and second terminal means to receive a mode switchover signal (SLEEP) to place the A/D circuitry either in a normal-power mode or in a low-power mode in which the power consumed between conversions is substantially less than that consumed during a conversion operation;

control circuitry for developing said CONVEN signal and said mode switchover signal, comprising:

first circuit means responsive to said CONVST signal for developing a CONVEN logic signal applied to said first terminal means to initiate an analog-to digital conversion;

second circuit means for developing said SLEEP signal for said second terminal means and comprising:

logic means receiving said BUSY signal and said CONVST signal and operable when said CONVST signal is of a predetermined logic status to produce said SLEEP signal so as to maintain normal power to said A/D converter at all times;

said logic means serving when said CONVST signal is of a logic status opposite said predetermined logic status to produce said SLEEP signal so as to place said A/D converter in its low-power condition between conversions.

5. Apparatus as in claim 4, wherein said logic means serves the function of a Nor gate having CONVST and BUSY as inputs and followed by an inverter.

6. Apparatus as in claim 5, including delay means to delay said SLEEP signal.

7. In an IC chip having A/D converter circuitry for converting an applied analog signal to a corresponding digital signal; said chip including one pin to which a conversion start (CONVST) control pulse can be applied from associated apparatus, said control pulse being either a first pulse of one polarity to provide for normal-power operation or alternatively a second pulse of opposite polarity to initiate low-power operation; means to transmit an end-of-conversion signal (EOC); said A/D circuitry including first terminal means to receive a convert-enable signal (CONVEN) for initiating a conversion and second terminal means to transmit a mode signal (SLEEP) to place the A/D circuitry in a low-power mode in which the power consumption between A/D conversions is substantially less than the power consumption rate during a conversion operation;

control circuitry for developing said CONVEN signal and said mode signal, comprising:

a first flip-flop having means to produce on an output terminal an output CONVEN signal responsive to and set by the voltage transition in a pre-selected direction of one of the two edges of said CONVST control pulse of said one polarity applied to said one pin of said chip;

means directing said output CONVEN signal to said first terminal means to initiate an analog-to-digital conversion in response to said output CONVEN signal from said first flip-flop when said first flip-flop receives a CONVST pulse having a voltage transition of said pre-selected direction at said one edge thereof;

means developing said EOC signal a preset time period after said CONVST control pulse to turn off said A/D converter;

said first flip-flop being responsive to the other edge of said alternative CONVST control pulse of opposite polarity and having a voltage transition in said pre-selected direction, thereby activating said CONVEN signal and with it said A/D converter upon occurrence of said other edge of said alternative control pulse; and a second flip-flop responsive to said alternative CONVST control pulse and including means to apply a mode signal (SLEEP) to said second terminal means to provide for low-power operation at the time of said EOC signal after said alternative CONVST signal has been applied and has subsided.

8. Apparatus as in claim 7, wherein said one edge of said CONVST pulse is its leading edge and said other edge is the trailing edge of the CONVST pulse.

9. Apparatus as in claim 8, wherein the leading edge of said first CONVST pulse is negative-going and the leading edge of said alternative CONVST pulse is positive-going.

* * * * *